United States Patent
He et al.

(10) Patent No.: US 8,710,661 B2
(45) Date of Patent: Apr. 29, 2014

(54) METHODS FOR SELECTIVE REVERSE MASK PLANARIZATION AND INTERCONNECT STRUCTURES FORMED THEREBY

(75) Inventors: Zhong-Xiang He, Essex Junction, VT (US); Anthony K. Stamper, Williston, VT (US); Eric J. White, Charlotte, VT (US)

(73) Assignee: International Business Machines Corporation, Armonk, NY (US)

( * ) Notice: Subject to any disclaimer, the term of this patent is extended or adjusted under 35 U.S.C. 154(b) by 776 days.

(21) Appl. No.: 12/323,512

(22) Filed: Nov. 26, 2008

(65) Prior Publication Data

US 2010/0127395 A1   May 27, 2010

(51) Int. Cl.
*H01L 23/522*   (2006.01)
(52) U.S. Cl.
USPC .................................. 257/752; 257/E23.142
(58) Field of Classification Search
USPC .......................................... 438/624, 697, 699
See application file for complete search history.

(56) References Cited

U.S. PATENT DOCUMENTS

| | | | | |
|---|---|---|---|---|
| 5,331,117 | A * | 7/1994 | Bryant et al. | 174/250 |
| 5,827,782 | A * | 10/1998 | Shih | 438/697 |
| 6,008,116 | A | 12/1999 | Tran | |
| 6,063,702 | A | 5/2000 | Chung | |
| 6,130,154 | A | 10/2000 | Yokoyama et al. | |
| 6,271,118 | B1 | 8/2001 | Wu et al. | |
| 6,331,380 | B1 | 12/2001 | Ye et al. | |
| 6,812,141 | B1 | 11/2004 | Gaidis et al. | |
| 6,939,797 | B2 | 9/2005 | Barth et al. | |
| 7,132,306 | B1 | 11/2006 | Rhee et al. | |
| 2002/0072221 | A1 | 6/2002 | Nishimura et al. | |
| 2002/0197796 | A1* | 12/2002 | Chang et al. | 438/257 |
| 2007/0049032 | A1* | 3/2007 | Abatchev et al. | 438/691 |

FOREIGN PATENT DOCUMENTS

JP   2005039244 A   2/2005

OTHER PUBLICATIONS

European Patent Office, Search Report and Written Opinon of the International Searching Authority issued in related international application No. PCT/EP2009/065696 dated Mar. 22, 2010.
The International Bureau of WIPO, International Preliminary Report on Patentability issued in related International Application No. PCT/EP2009/065696 dated May 31, 2011.

* cited by examiner

*Primary Examiner* — Seahvosh Nikmanesh
(74) *Attorney, Agent, or Firm* — Wood, Herron & Evans LLP; Anthony J. Canale

(57) ABSTRACT

Methods for planarizing layers of a material, such as a dielectric, and interconnect structures formed by the planarization methods. The method includes depositing a first dielectric layer on a top surface of multiple conductive features and on a top surface of a substrate between the conductive features. A portion of the first dielectric layer is selectively removed from the top surface of at least one of the conductive features without removing a portion the first dielectric layer that is between the conductive features. A second dielectric layer is formed on the top surface of the at least one of the conductive features and on a top surface of the first dielectric layer, and a top surface of the second dielectric layer is planarized. A layer operating as an etch stop is located between the top surface of at least one of the conductive features and the second dielectric layer.

26 Claims, 8 Drawing Sheets

METHODS FOR SELECTIVE REVERSE MASK PLANARIZATION AND INTERCONNECT STRUCTURES FORMED THEREBY

BACKGROUND

The invention relates generally to semiconductor device fabrication and, in particular, to methods for planarizing layers of dielectric material during semiconductor device fabrication and structures formed by the planarization methods.

The manufacture of integrated circuit chips generally involves the deposition and patterning of a series of layers composed of different types of materials. In the semiconductor industry, chemical mechanical polishing (CMP) is a commonly used technique for smoothing, planarizing, and/or removing layers from a wafer during manufacture. To execute a CMP process, a wet abrasive and corrosive slurry is dispersed between the surface to be polished and a flexible polishing pad. The polishing pad has a contacting relationship with the surface and the polishing pad and wafer are spun relative to the other to smooth and planarize (i.e., flatten) the contacted surface on the wafer by material removal. The CMP system typically includes a polishing head that presses the rotating wafer against the flexible polishing pad. The CMP process combines the chemical removal effect of an acidic or basic fluid solution operating as the carrier of the slurry with the mechanical removal effect provided by an abrasive material of the slurry that is suspended in the carrier.

Improved methods and structures are needed for CMP processes, especially CMP processes employed to planarize material layers used in semiconductor device fabrication and, in particular, CMP processes employed to planarize interlayer dielectric layers used in fabricating back-end-of-line (BEOL) interconnect structures.

BRIEF SUMMARY

In one embodiment of the invention, a planarization method is provided that includes forming a plurality of conductive features on a substrate, depositing a first dielectric layer on a top surface of the conductive features and on a top surface of the substrate between the conductive features, and selectively removing a first portion of the first dielectric layer from the top surface of at least one of the conductive features without removing a second portion of the first dielectric layer that is located between the conductive features. The planarization method further includes forming a second dielectric layer on the top surface of the at least one of the conductive features and on a top surface of the second portion of the dielectric layer. A top surface of the second dielectric layer is then planarized.

In another embodiment of the invention, an interconnect structure includes a first dielectric layer having a top surface, a second dielectric layer directly on the top surface of the first dielectric layer, a plurality of conductive features in the first dielectric layer, and an etch stop layer on the top surface of at least one of the conductive features. Each of the conductive features has a top surface substantially coplanar with the top surface of the first dielectric layer. The etch stop layer is disposed between the top surface of at least one of the conductive features and the second dielectric layer.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
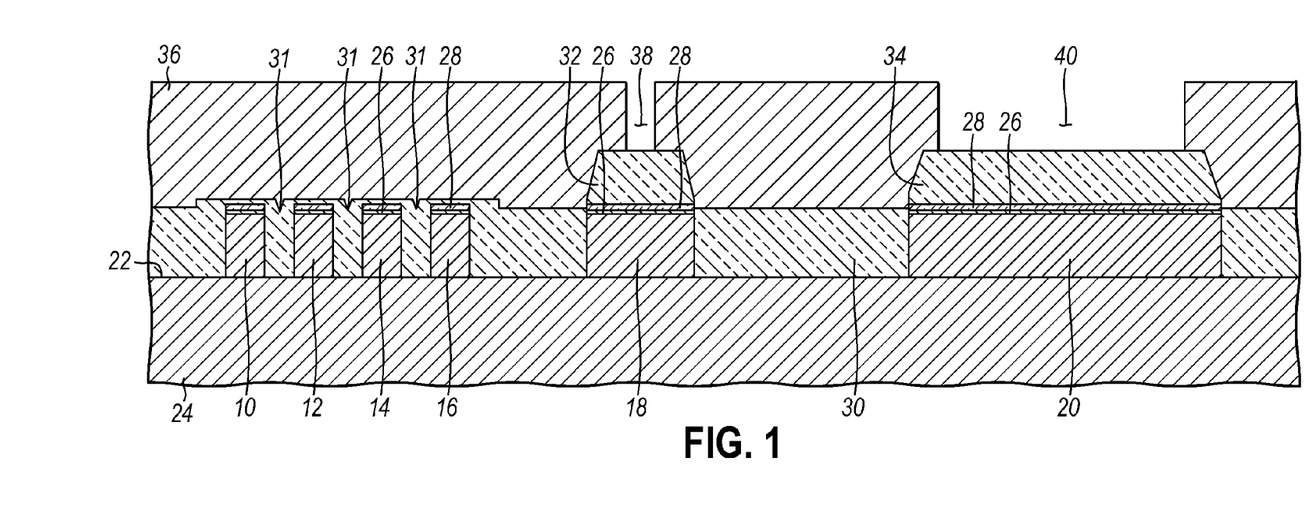
FIGS. 1-5 are diagrammatic cross-sectional views of a portion of a substrate at successive fabrication stages of a processing method in accordance with an embodiment of the invention.

With reference to FIG. 1 and in accordance with an embodiment of the invention, a plurality of relatively small width features 10, 12, 14, 16, a medium width feature 18, and a relatively large width feature 20 are directly supported on a top surface 22 of a substrate 24. Substrate 24 may be any suitable substrate that a person having ordinary skill in the art would recognize as used in the fabrication of an integrated circuit. For example, the substrate 24 may be an interlayer dielectric (ILD) layer of an underlying metallization or via level in a back-end-of-line (BEOL) interconnect structure and may include wires and/or stud-filled vias (not shown) as understood by a person having ordinary skill in the art.

The features 10, 12, 14, 16, 18, 20 may be wires of the BEOL interconnect structure as these structures are understood by a person having ordinary skill in the art. The features 10, 12, 14, 16, 18, 20 may be composed of a conductive material, such as aluminum or aluminum alloyed with another material like silicon or copper. A top surface of each of the features 10, 12, 14, 16, 18, 20 is covered by a bottom antireflective coating (BARC) layer 26 and an etch stop layer 28 of a dielectric material separated in each instance from the top surface by the BARC layer 26. The etch stop layer 28 may be composed of a dielectric material, such as silicon nitride ($Si_3N_4$). The BARC layer 26, which provides a reduced reflectivity for prospective lithography processes, is composed of an organic or inorganic material that is characterized by a lower reflectivity than the conductive material of the features 10, 12, 14, 16, 18, 20. Common inorganic materials for the BARC layer 26 include, but are not limited to, metal oxides like titanium dioxide ($TiO_2$) and chromium oxide, and metal nitrides like titanium nitride (TiN). The BARC layer 26 and the etch stop layer 28 may be applied with physical vapor deposition (PVD), chemical vapor deposition (CVD), or another conventional deposition technology. The etch stop layer 28 is deposited to a thickness sufficient that the resultant layer will act as an effective etch stop to a subsequent dielectric etch process, as described below. Generally, the BARC layer 26 and etch stop layer 28 are significantly thinner than the height of the features 10, 12, 14, 16, 18, 20 and are only applied to the top surfaces of the features 10, 12, 14, 16, 18, 20.

In one embodiment, a layer of the conductive material contained in the features 10, 12, 14, 16, 18, 20 and overlying layers of the dielectric materials in the BARC layer 26 and etch stop layer 28 are serially deposited in the proper sequence on the top surface 22 of the substrate 24. A conventional lithography and subtractive etching process is then used to pattern these serially deposited conductive and dielectric layers. The lithography portion of the process applies a radiation-sensitive resist (not shown) on the deposited layers, exposes the resist to a pattern of radiation (e.g., light, x-rays, or an electron beam), and develops the latent transferred pattern to define openings in the resist that expose portions of the conductive material and dielectric material layers to be removed from the top surface 22. The masked portions of the conductive material layer coincide with the prospective locations of the features 10, 12, 14, 16, 18, 20. The openings in the resist have a line width selected to provide the different widths for the features 10, 12, 14, 16, 18, 20 and a selected line spacing between adjacent features. The features 10, 12, 14, 16 define a low density pattern containing multiple features with a relatively small line spacing.

The subtractive etching portion of the process involves an anisotropic dry etch process, like reactive ion etching (RIE) or plasma etching, that transfers the pattern in the resist to the conductive material and dielectric material layers. The subtractive etching process, which relies on one or more etchant chemistries to remove the different conductive and dielectric materials, stops on the constituent material contained in the substrate 24. The etchant chemistry used to remove the conductive material removes the conductive material selective to (i.e., at a higher etch rate than) the material constituting the substrate 24. The features 10, 12, 14, 16, 18, 20 represent residual portions of the conductive material layer that are masked by the patterned resist layer during the subtractive etching process. Features 10, 12, 14, 16 have the smallest line width, such as the minimum line width, feature 20 has the largest line width, and feature 18 has an intermediate line width. After etching, the resist is removed by ashing or solvent stripping.

In an alternative embodiment, the etch stop layer 28 may be conformally deposited on the top surfaces of features 10, 12, 14, 16, 18, 20 following the conclusion of the subtractive etching process, instead of before the subtractive etching process is executed.

A dielectric layer 30 is formed on the exposed portions of the top surface 22 and across the features 10, 12, 14, 16, 18, 20. The dielectric material contained in the dielectric layer 30 may be composed of, for example, an oxide of silicon, such as silicon dioxide ($SiO_2$), or a fluorosilicate glass (FSG) deposited by a high density plasma chemical vapor deposition (HDPCVD) process. Silicon dioxide may be deposited by a HDPCVD process using a mixture of process gases including silane ($SiH_4$), oxygen ($O_2$), and argon (Ar). Because of the addition of a sputter component to a plasma deposition process, HDPCVD processes can be controlled to promote gap-filling during deposition in a manner superior to conventional CVD processes. Generally, a dielectric layer deposited by HDPCVD possesses superior density, moisture resistance and planarization properties in comparison with conventional CVD dielectric layers. HDPCVD processes are characterized by a reduced level of conformality (i.e., non-conformality) with the topography of the top surface 22 and features 10, 12, 14, 16, 18, 20 in comparison with conventional CVD processes. The dielectric layer 30 is highly non-conformal with significantly greater thicknesses of dielectric material residing on horizontal surfaces of the substrate 24 and features 10, 12, 14, 16, 18, 20 as opposed to vertical surfaces.

Portions of the dielectric layer 30 fill the gaps between features 10, 12, 14, 16, 18, 20 to define a metallization level of the BEOL interconnect structure. Other portions of the dielectric layer 30, which deposit on the top surfaces of the features 10, 12, 14, 16, 18, 20, are separated from these top surfaces by the BARC layer 26 and the etch stop layer 28. Because of the nature of the surface topography, the dielectric material in the dielectric layer 30 includes irregularities in the form of shallow recesses 31 between the features 10, 12, 14, 16. Portions 32, 34 of the dielectric material reside on the top surfaces of features 18, 20. The thickness of the dielectric layer 30 is slightly larger than the height of features 10, 12, 14, 16, 18, 20 measured relative to the top surface 22 and, in one embodiment, the thickness of the dielectric layer 30 is approximately equal to about 110% of the height of features 10, 12, 14, 16, 18, 20.

The presence of etch stop layer 28 promotes the thickness reduction and eliminates RIE variability inherent in conventional reverse mask dielectric etch back processes that are applied during the chemical mechanical planarization of a dielectric layer of much greater thickness. The dielectric material contained in the etch stop layer 28 has good etch selectivity in comparison with the dielectric material contained in the dielectric layer 30.

The lines and spaces (L/S) layout rules for the features 10, 12, 14, 16, 18, 20 may be selected to aid in subsequent planarization of the dielectric layer 30. Specifically, the spacing for the features 10, 12, 14, 16, 18, 20 may be selected to be four (4) times the minimum spacing, or larger, which is believed to reduce the occurrence of voids in the dielectric layer 30 in the gaps between adjacent features 10, 12, 14, 16, 18, 20. In addition, the maximum width for the features 10, 12, 14, 16, 18, 20 may be selected to be at least two (2) times the height of the features 10, 12, 14, 16, 18, 20, which may aid in planarization during deposition of dielectric layer 30.

In certain embodiments, the height of the features 10, 12, 14, 16, 18, 20 is 4 μm or taller. The selective reverse planarization process described herein is particularly applicable to such tall features in comparison with a conventional reverse planarization process that includes chemical mechanical planarization or with conventional chemical mechanical planarization alone. These conventional planarization approaches result in an acceptable via height variability for features with heights of 1 μm or less. However, the via height variability scales for these conventional planarization approaches upwardly with increasing feature height. These conventional planarization approaches fail to provide an acceptable via height variability for comparatively tall features with heights greater than 1 μm and, in particular, for features with heights greater than 4 μm.

A reverse mask layer 36 is formed from a radiation-sensitive resist that is applied on the dielectric layer 30 and patterned with a conventional photolithography process. The resist is applied by a spin coating process and then heated in a soft baking or pre-baking process to drive off excess solvent and to promote partial solidification. In the photolithography process, the resist is exposed to radiation imaged using a photomask, baked after exposure, and developed to define residual areas of resist that operate as the reverse mask layer 36. In photolithography, a pattern of radiation is generated using a photomask and an optical stepper of a lithography tool and then imaged onto the resist. If the resist is, for example, a positive resist, regions exposed to the radiation become chemically less stable to promote removal when the resist is developed and regions that are not exposed to the radiation remain chemically stable so that they remain intact when the resist is developed.

After patterning, the reverse mask layer 36 includes a feature pattern with apertures or openings 38, 40 that extend to the depth of the dielectric layer 30. The openings 38, 40 operate as windows that substantially coincide with the locations of the portions 32, 34 of dielectric layer 30 that covers the top surfaces of features 18, 20. The widths of the openings 38, 40 are slightly narrower than the widths of the respective portions 32, 34 of the dielectric layer 30 to ensure that the subsequent etching process will stop on the etch stop layer 28. The reverse mask layer 36 covers and protects the remainder of the dielectric layer 30. The reverse mask layer 36 is a substantial reverse image of the mask used to pattern the features 10, 12, 14, 16, 18, 20.

Figure 2:
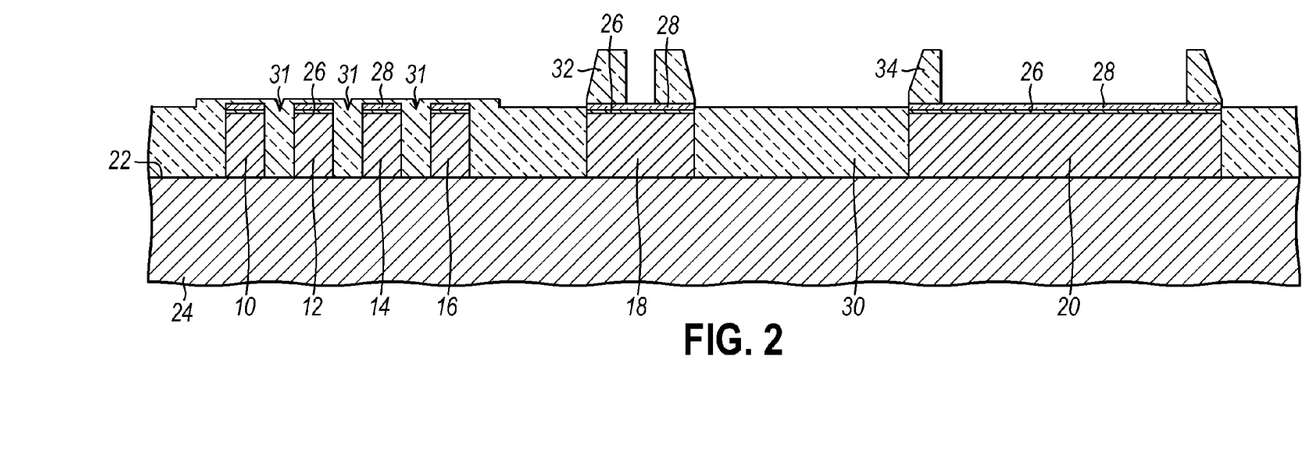

With reference to FIG. 2 in which like reference numerals refer to like features in FIG. 1 and at a subsequent fabrication stage, an anisotropic dry etch process, such as a reactive ion etching (RIE) process, is used to partially remove the portions 32, 34 of dielectric material exposed by the openings 38, 40 in the reverse mask layer 36. The dry etch process relies on an etchant chemistry that removes the dielectric material of the dielectric layer 30 selective to (i.e., at a higher etch rate than) the material constituting the etch stop layer 28 and stops on the etch stop layer 28. After the resist is removed by ashing or solvent stripping, the top surface 22 is cleaned using a conventional cleaning process. The reverse mask process removes a thickness of dielectric material in the mounds 32, 34 exposed by the openings 38, 40 approximately equal to the deposited thickness of the dielectric layer 30 because of the presence of the etch stop layer 28.

Figure 3:
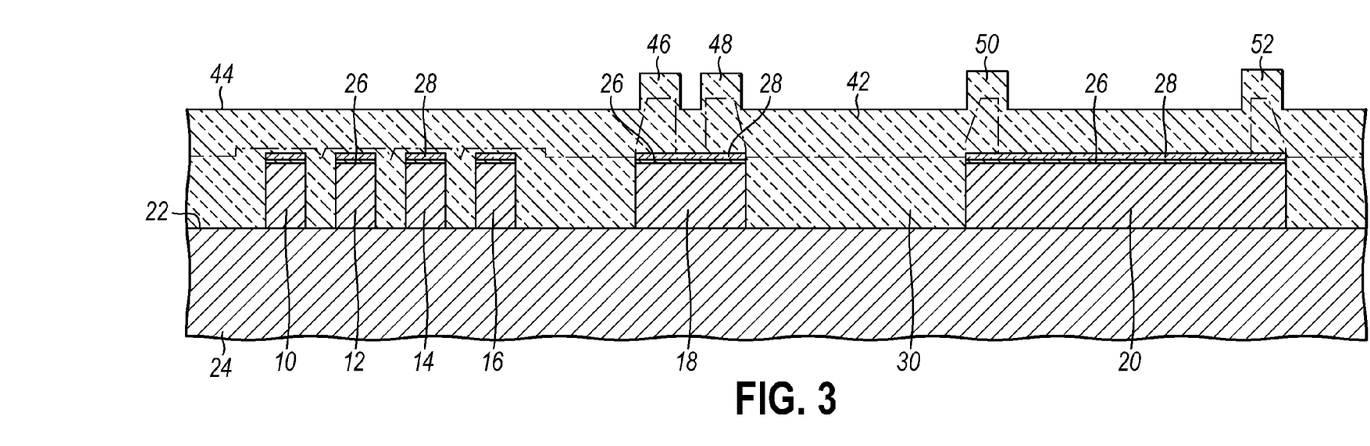

With reference to FIG. 3 in which like reference numerals refer to like features in FIG. 2 and at a subsequent fabrication stage, a dielectric layer 42 is conformally deposited on the dielectric layer 30 and across the features 10, 12, 14, 16, 18, 20. The dielectric material constituting the dielectric layer 42 may be, for example, composed of an oxide of silicon, such as $SiO_2$, or FSG deposited conformally by a plasma enhanced chemical vapor deposition (PECVD) process. The dielectric layer 42 is highly conformal (i.e., of approximately the same thickness, for example, within ±2-10% of the average thickness) on vertical and horizontal surfaces. In one embodiment, the dielectric layers 30 and 42 are composed of the same dielectric material. The thickness of the dielectric layer 42 is less than the height of features 10, 12, 14, 16, 18, 20 measured relative to the top surface 22. The top surface 44 of the dielectric layer 42 has an undulating or rippled surface profile with protrusions 46, 48, 50, 52 that coincide with the unetched remainder of the portions 32, 34 of the dielectric layer 30. In one embodiment, the thickness of the dielectric layer 42 is approximately equal to about 50% of the height of features 10, 12, 14, 16, 18, 20. Generally, the dielectric layer 42 is thinner than dielectric layer 30 and, in certain embodiments, the thickness of the dielectric layer 42 is approximately one-half or less of the thickness of dielectric layer 30.

Figure 4:
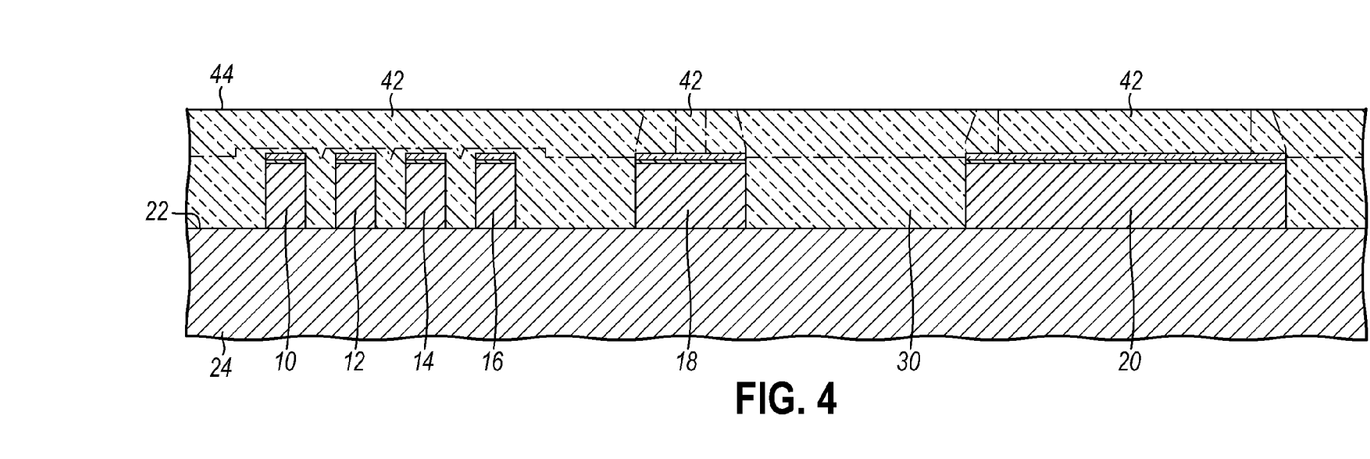

With reference to FIG. 4 in which like reference numerals refer to like features in FIG. 3 and at a subsequent fabrication stage, a polishing operation, preferably a chemical mechanical polishing (CMP) process, is conducted to polish the dielectric layer 42 until the top surface 44 is substantially planar and flat. As the top surface 44 of the dielectric layer 42 is polished, the CMP process removes the protrusions 46, 48, 50, 52. For example, the CMP process may remove a thickness of the dielectric layer 42 equal to 25% of the height of the conductive features 10, 12, 14, 16, 18, 20. A buffered etchant is used to clean residual slurry from the top surface 44 that remains following the CMP process. The use of the reverse mask layer 36 in a preceding fabrication stage to partially remove the portions 32, 34 of dielectric layer 42 improves the surface uniformity of the CMP process. After polishing, the dielectric layer 30 defines an intermetal dielectric (IMD) layer in which the features 10, 12, 14, 16, 18, 20 are embedded and the dielectric layer 42 defines at least a partial thickness, if not an entire thickness, of an ILD layer.

Figure 5:
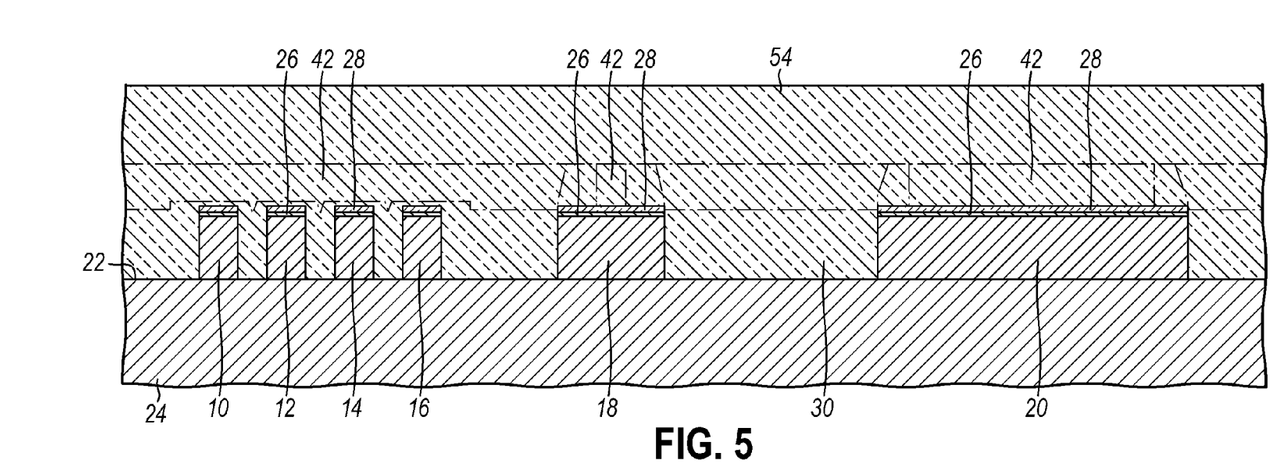

With reference to FIG. 5 in which like reference numerals refer to like features in FIG. 4 and at a subsequent fabrication stage, a dielectric layer 54 is deposited on the planarized top surface 44 of dielectric layer 42. The dielectric material in dielectric layer 54 may be composed of, for example, $SiO_2$ or FSG deposited by a PECVD process. In one embodiment, dielectric layer 54 is composed of the same dielectric material as either or both of the dielectric layers 30, 42. The dielectric layer 54 represents the remaining thickness for the interlayer dielectric, in combination with the remaining thicknesses of dielectric layers 30, 42, to be used in subsequent fabrication stages to contact the features 10, 12, 14, 16, 18, 20 and to potentially support an additional interlayer dielectric. Dielectric layer 54 and the residual thickness of dielectric layer 42 after planarization of top surface 44 define the ILD layer in which stud-filled vias (not shown) are formed to contact the features 10, 12, 14, 16, 18, 20. Dielectric layer 54 is optional is dielectric layer 42 provides an adequate layer thickness for the ILD layer.

In conventional reverse mask planarization processes, the entire thickness of the interlayer dielectric is initially deposited across the conductive features. As an example of a conventional reverse mask planarization process for 4 µm high AlCu wires, a 7 µm thick layer of $SiO_2$ may be applied, 4 µm of the thickness of the $SiO_2$ layer may be removed with a reverse mask RIE, and then 4 µm of the thickness of the $SiO_2$ layer may be removed with a CMP process. Using nominal variabilities of 5% of the thickness for the dielectric deposition, 25% of the removed dielectric thickness for the reverse mask RIE, and 40% of the removed thickness for the CMP process, the root sum square (RSS) of the variations is equal to ±1.2 µm. Hence, for feature heights of 4 µm, the final thickness of the resulting interlayer dielectric layer may vary by ±1.2 µm, which leads to significant variations in via heights for contacting the features 10, 12, 14, 16, 18, 20.

In embodiments of the invention, the deposition of the dielectric material for the IMD and ILD is split into multiple distinct layers at different junctures in the fabrication process. The total sum of the individual thickness of the dielectric layers 30, 42 used in the inventive selective reverse mask planarization process is significantly less than the thickness of the interlayer dielectric applied and etched in a conventional reverse mask planarization process. As an example of a selective reverse mask planarization process for 4 µm high AlCu wires, a 4 µm thick layer of $SiO_2$ may be applied as dielectric layer 30, 4 µm of the thickness of the $SiO_2$ layer reflected in the portions 32, 34 may be removed using the reverse mask layer 36 and stopping on the etch stop layer 28, another 4 µm thick layer of $SiO_2$ may be applied as dielectric layer 42, and then 4 µm of the thickness of the $SiO_2$ layer may be removed with a CMP process. Using the same nominal variabilities for dielectric deposition and the CMP process, the RSS of the variations using the selective reverse mask planarization is equal to ±0.5 µm. The presence of the etch stop layer 28 eliminates the variability in physical layer thickness arising from the reverse mask RIE. The ability to reduce the variation in the thickness of the interlayer dielectric reduces the via height variability for contacting the features 10, 12, 14, 16, 18, 20 in comparison with the interlayer dielectric resulting from a conventional reverse mask planarization process.

Figure 6:
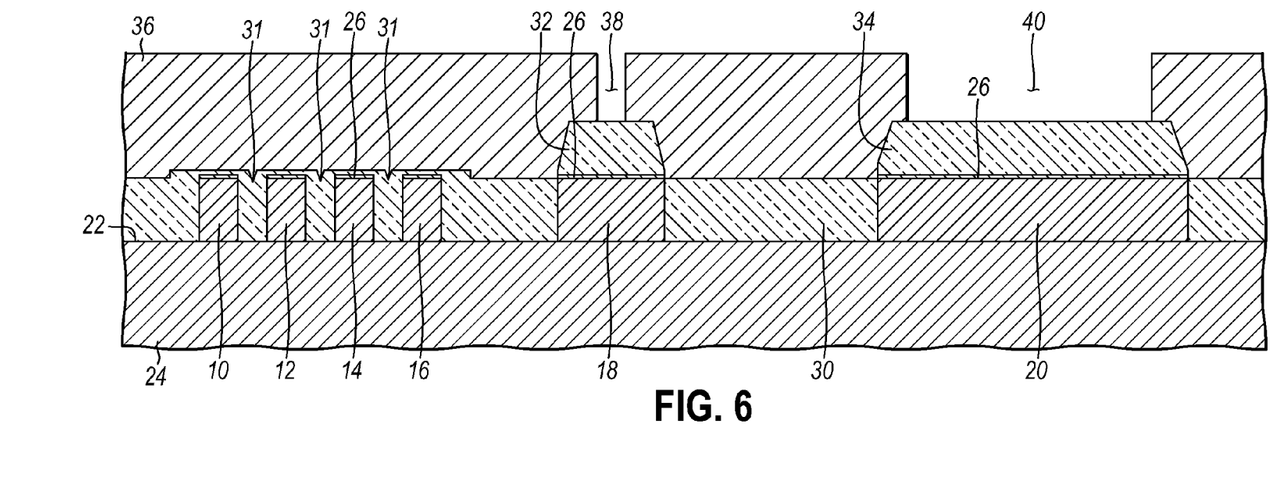
FIGS. 6-8 are diagrammatic cross-sectional views of a portion of a substrate at successive fabrication stages of a processing method in accordance with an embodiment of the invention.

With reference to FIG. 6 in which like reference numerals refer to like features in FIG. 1 and in accordance with an alternative embodiment, the etch stop layer 28 may be omitted from the initial structure if the material of the BARC layer 26 is capable of providing the etch stop functionality during the reverse mask etch process. Accordingly, the top surfaces of the features 10, 12, 14, 16, 18, 20 are initially covered only by the BARC layer 26 before the reverse mask layer 36 is applied and the portions 32, 34 of the dielectric layer 30 are partially removed by etching. Alternatively, the etch stop layer 28 may provide the functionality of a bottom antireflection coating layer so that the BARC layer 26 may be omitted from the layer stack.

Figure 7:
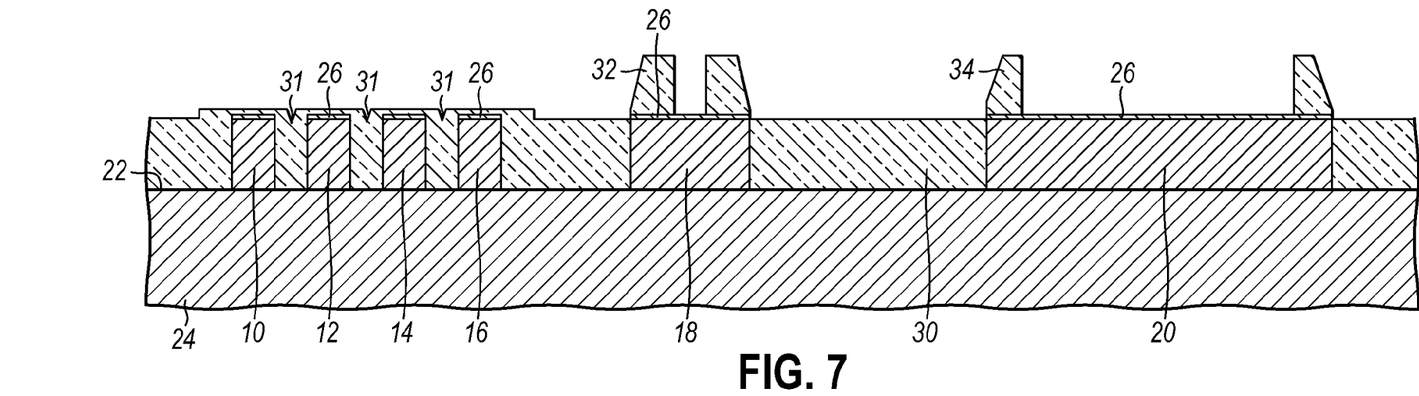
Figure 8:
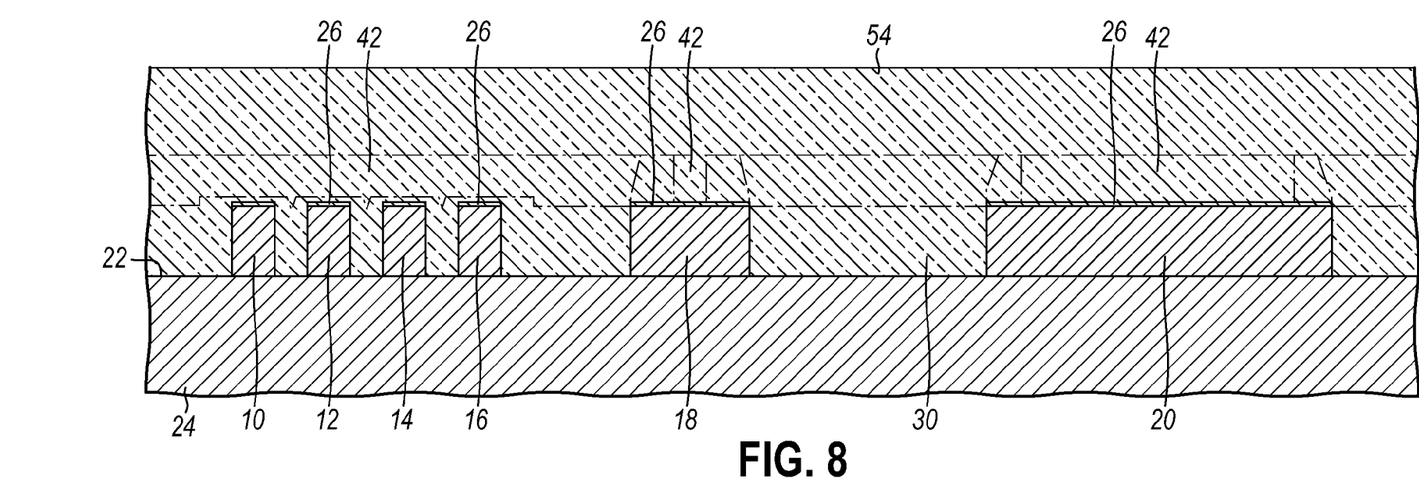

With reference to FIG. 7 in which like reference numerals refer to like features in FIG. 6 and at a subsequent fabrication stage, the anisotropic dry etch process is used to remove the portions 32, 34 of the dielectric layer 30 exposed through the openings 38, 40 in the reverse mask layer 36. The dry etch process is similar to the process performed in conjunction with the fabrication stage of FIG. 2, other than the use of the BARC layer 26 as an etch stop layer. Processing continues at the fabrication stage of FIG. 3, as described above, and results in an interconnect structure as shown in FIG. 8.

Figure 9:
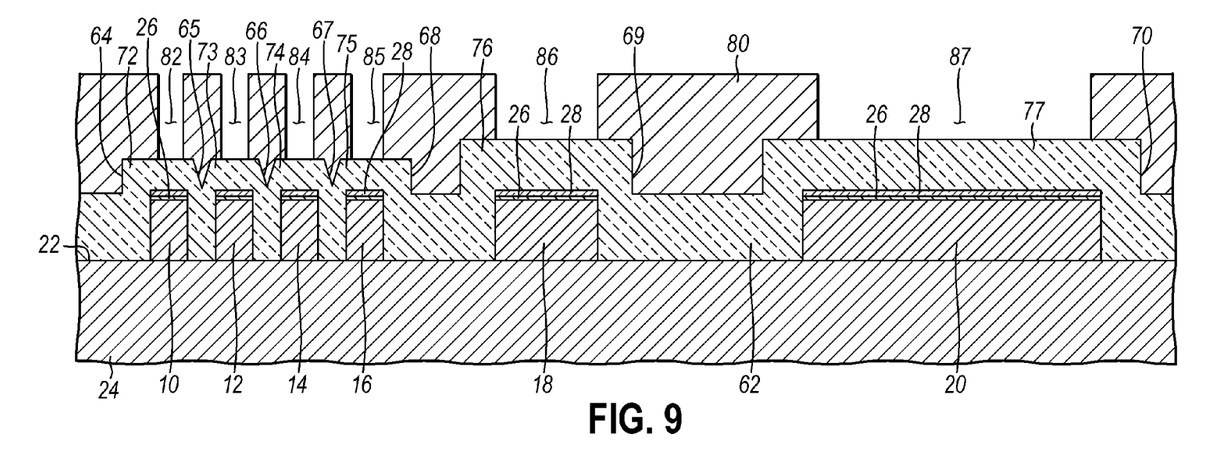
FIGS. 9-13 are diagrammatic cross-sectional views of a portion of a substrate at successive fabrication stages of a processing method in accordance with an embodiment of the invention.

With reference to FIG. 9 in which like reference numerals refer to like features in FIG. 1 and in accordance with an alternative embodiment, a dielectric layer 62 is formed on the top surface 22 of the substrate 24 and across the features 10, 12, 14, 16, 18, 20. The dielectric layer 62 may be, for example, composed of an oxide of silicon, such as $SiO_2$, or FSG, conformally deposited by a PECVD process. Gaps between features 10, 12, 14, 16, 18, 20 are filled by portions of the dielectric layer 62 and the top surfaces of the features 10, 12, 14, 16, 18, 20 are covered by other portions of the dielectric layer 62, which are separated from these top surfaces by the BARC layer 26 and the etch stop layer 28. The dielectric layer 62 has an irregular topography with a surface profile that includes recesses 64, 65, 66, 67, 68, 69, 70 defined between the features 10, 12, 14, 16, 18, 20 and portions 72, 73, 74, 75, 76, 77 of the dielectric material on the top surfaces of features 10, 12, 14, 16, 18, 20. The thickness of the dielectric layer 62 is slightly larger than the height of features 10, 12, 14, 16, 18, 20 measured relative to the top surface 22 and, in one embodiment, the thickness of the dielectric layer 62 is approximately 125% of the height of features 10, 12, 14, 16, 18, 20.

A reverse mask layer 80, which is similar to reverse mask layer 36, is formed on the dielectric layer 62. The reverse mask layer 80 includes a feature pattern with apertures or openings 82, 83, 84, 85, 86, 87 that are registered with the locations of the portions 72-77 of the dielectric layer 62. The widths of the openings 82-87 are slightly narrower than the widths of the respective portions 72-77.

Figure 10:
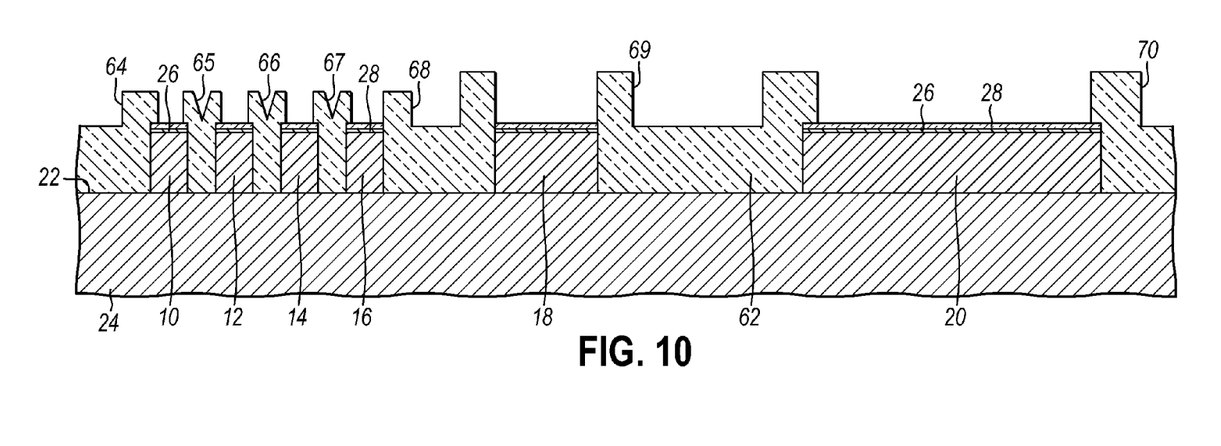

With reference to FIG. 10 in which like reference numerals refer to like features in FIG. 9 and at a subsequent fabrication stage, an anisotropic dry etch process, such as a RIE process, is used to remove the portions 72-77 of dielectric layer 62 exposed by the openings 82-87 in the reverse mask layer 36. The dry etch process relies on an etchant chemistry that removes the dielectric material of dielectric layer 62 selective to (i.e., at a higher etch rate than) the material constituting the etch stop layer 28 and stops on the constituent material of the etch stop layer 28. Each of the portions 72-77 of dielectric layer 62 is partially removed by the dry etch process. The resist is subsequently removed by ashing or solvent stripping and the top surface 22 is cleaned with a conventional cleaning process. The reverse mask process removes a thickness of dielectric material in the portions 72-77 exposed by the openings 82-87 approximately equal to the height of the features 10, 12, 14, 16, 18, 20 because of the presence of the etch stop layer 28.

Figure 11:
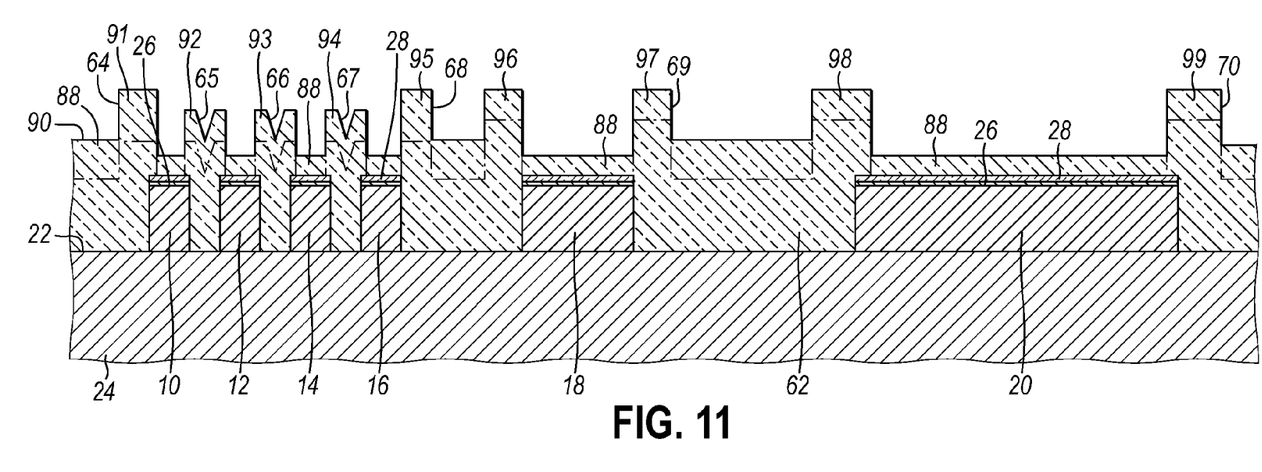

With reference to FIG. 11 in which like reference numerals refer to like features in FIG. 10 and at a subsequent fabrication stage, a dielectric layer 88, which is similar to dielectric layer 42 (FIG. 3), is deposited on the dielectric layer 62 and across the features 10, 12, 14, 16, 18, 20. The dielectric material constituting the dielectric layer 88 may be composed of an oxide of silicon, such as $SiO_2$, or FSG deposited by a PECVD process. In one embodiment, the dielectric layers 62 and 88 are composed of the same dielectric material. The thickness of the dielectric layer 88 is less than the height of features 10, 12, 14, 16, 18, 20 measured relative to the top surface 22. The top surface 90 of the dielectric layer 88 has an undulating or rippled appearance with protrusions 91, 92, 93, 94, 95, 96, 97, 98, 99 that coincide with the remainder of the portions 72-77 of the dielectric layer 30. In one embodiment, the thickness of the dielectric layer 42 is approximately equal to about 50% of the height of features 10, 12, 14, 16, 18, 20.

Figure 12:
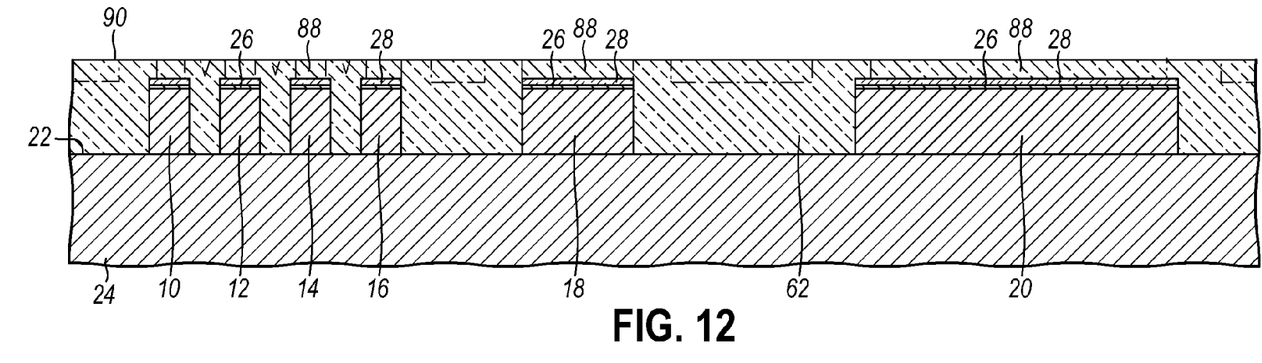

With reference to FIG. 12 in which like reference numerals refer to like features in FIG. 11 and at a subsequent fabrication stage, a polishing operation, preferably a CMP process, is conducted to polish the dielectric layer 88 until the top surface 90 is substantially planar and flat. As the top surface 90 is recessed, the CMP process removes the protruding structures 91-99. For example, the CMP process may remove a thickness of the dielectric layer 88 equal to 25% of the height of the conductive features 10, 12, 14, 16, 18, 20. A buffered etchant is used to clean residual slurry from the top surface 90 that remains following the CMP process. After polishing, the dielectric layer 62 defines an IMD layer in which the features 10, 12, 14, 16, 18, 20 are embedded and the dielectric layer 88 defines at least a portion, if not all, of an ILD layer. Generally, the dielectric layer 88 is thinner than dielectric layer 62. In certain specific embodiments, the thickness of dielectric layer 88 is approximately one-half or less of the thickness of dielectric layer 62.

Figure 13:
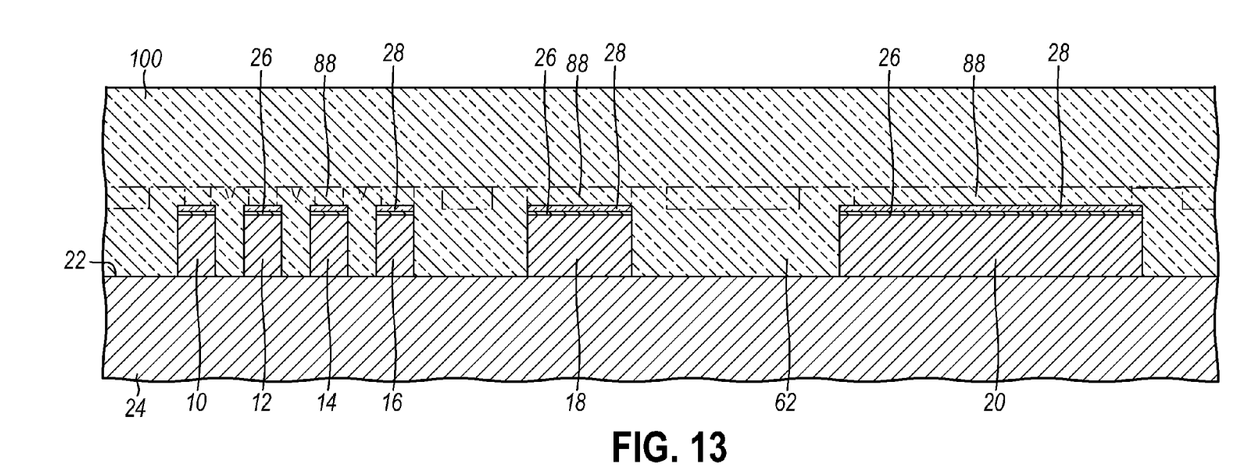

With reference to FIG. 13 in which like reference numerals refer to like features in FIG. 12 and at a subsequent fabrication stage, a dielectric layer 100, which is similar to dielectric layer 54, is deposited on the planarized top surface 90. The dielectric material in the dielectric layer 100 may be, for example, composed of $SiO_2$ or FSG deposited by a PECVD process. Dielectric layer 100 may be composed of the same dielectric material as either or both of layers 62, 88. The dielectric layer 100 represents the remaining thickness for the interlayer dielectric to be used in subsequent fabrication stages. Dielectric layer 100 and the residual thickness of dielectric layer 88 after planarization of the top surface 90 define an ILD layer in which stud-filled vias (not shown) are formed to contact the features 10, 12, 14, 16, 18, 20. The ability to split the deposition of the IMD and ILD into multiple dielectric layers 62, 88, 100 and the use of the etch stop layer 28 has benefits, as explained above with regard to the embodiment of FIGS. 1-5. Dielectric layer 100 is optional is dielectric layer 88 provides an adequate layer thickness for the ILD layer.

Figure 14:
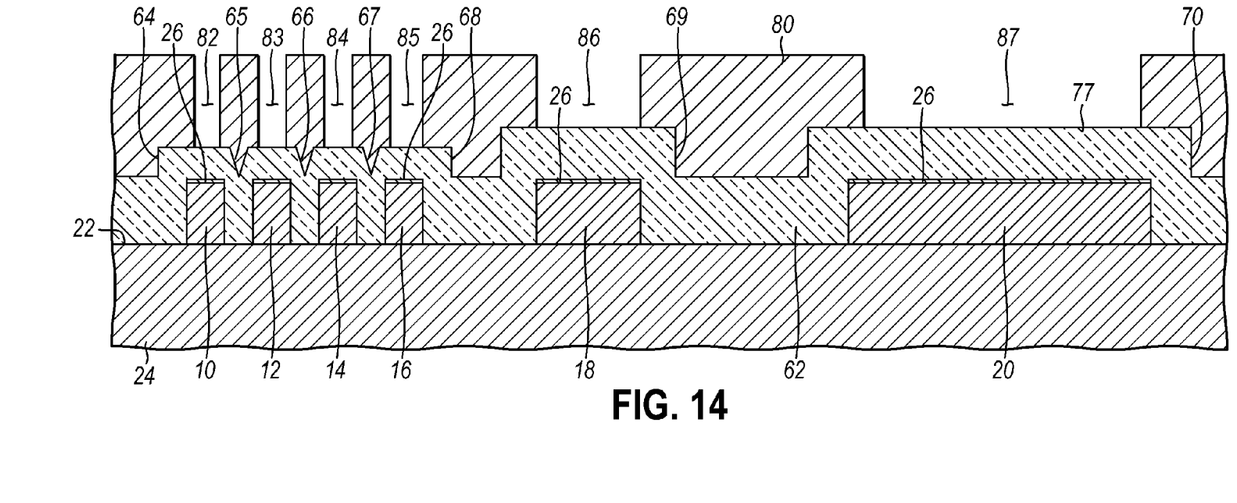
FIGS. 14-16 are diagrammatic cross-sectional views of a portion of a substrate at successive fabrication stages of a processing method in accordance with an alternative embodiment of the invention.

With reference to FIG. 14 in which like reference numerals refer to like features in FIG. 13 and at a subsequent fabrication stage in accordance with an alternative embodiment, the etch stop layer 28 may be omitted if the material of the BARC layer 26 is capable of providing the etch stop functionality during the reverse mask etch process. Specifically, the top surfaces of the features 10, 12, 14, 16, 18, 20 are initially covered only by the BARC layer 26 before the reverse mask layer 80 is applied. Alternatively, the etch stop layer 28 may provide the functionality of a bottom antireflection coating layer so that the BARC layer 26 may be omitted from the layer stack.

Figure 15:
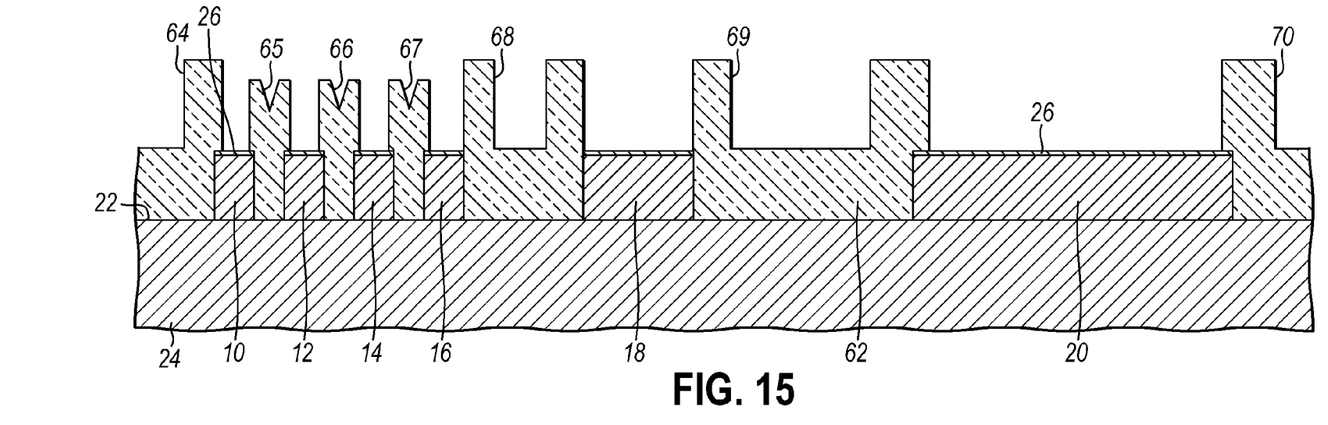
Figure 16:
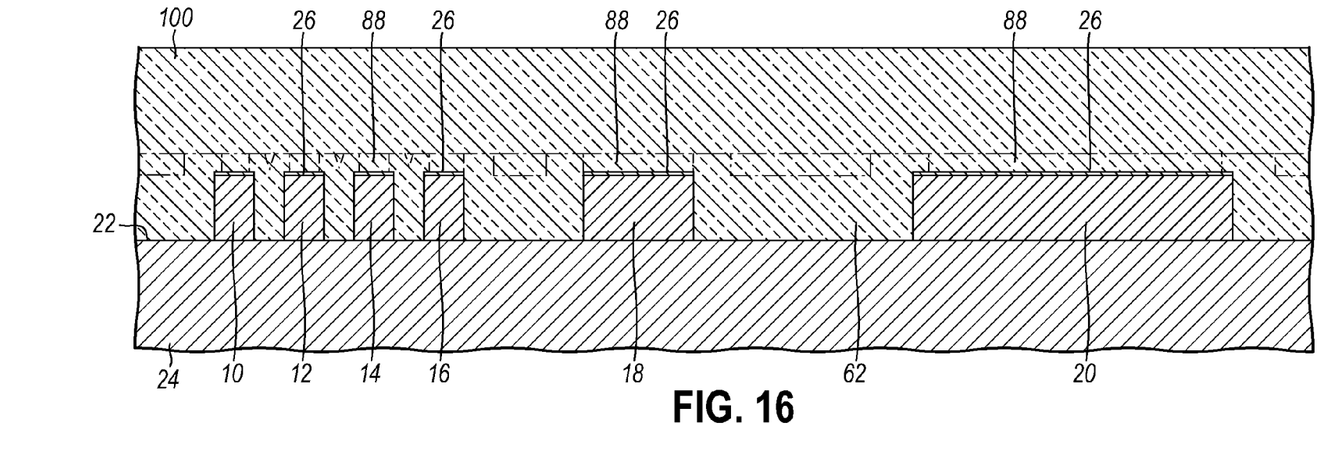

With reference to FIG. 15 in which like reference numerals refer to like features in FIG. 14 and at a subsequent fabrication stage, the anisotropic dry etch process is used to remove the portions 72-77 of dielectric layer 62 exposed through the openings 82-87 in the reverse mask layer 80. The dry etch process is similar to the process performed in conjunction with the fabrication stage of FIG. 10 and the fabrication stage of FIG. 2, other than the use of the BARC layer 26 as an etch stop layer. Processing continues at the fabrication stage of FIG. 11, as described above, to produce the interconnect structure shown in FIG. 16.

The methods, as described above, are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multi-chip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The term "vertical" refers to a direction perpendicular to the horizontal, as just defined. Terms, such as "on", "above", "below", "side" (as in "sidewall"), "upper", "lower", "over", "beneath", and "under", are defined with respect to the horizontal plane. It is understood that various other frames of reference may be employed for describing the invention without departing from the spirit and scope of the invention. It is also understood that features of the invention are not necessarily shown to scale in the drawings. Furthermore, to the extent that the terms "composed of", "includes", "having", "has", "with", or variants thereof are used in either the detailed description or the claims, such terms are intended to be inclusive in a manner similar to the term "comprising."

It will be understood that when an element as a layer, region or substrate is described as being "on" or "over" another element, it can be directly on or over the other element or intervening elements may also be present. In contrast, when an element is described as being "directly on" or "directly over" another element, there are no intervening elements present. It will also be understood that when an element is described as being "attached", "connected", or "coupled" to another element, it can be directly connected or coupled to the other element or intervening elements may be present. In contrast, when an element is described as being "directly attached", "directly connected", or "directly coupled" to another element, there are no intervening elements present.

The fabrication of the structures herein has been described by a specific order of fabrication stages and steps. However, it is understood that the order may differ from that described. For example, the order of two or more fabrication steps may be swapped relative to the order shown. Moreover, two or more fabrication steps may be conducted either concurrently or with partial concurrence. In addition, various fabrication steps may be omitted and other fabrication steps may be added. It is understood that all such variations are within the scope of the present invention. It is also understood that features of the present invention are not necessarily shown to scale in the drawings.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A planarization method comprising:
    forming a conductive layer on a substrate;
    forming an etch stop layer on a top surface of the conductive layer;
    patterning the conductive layer and the etch stop layer on the top surface of the conductive layer to form a plurality of conductive features each covered by a portion of the etch stop layer;
    after the conductive layer and the etch stop layer are patterned, depositing a first dielectric layer on a top surface of the conductive features and on a top surface of the substrate between the conductive features;
    selectively etching a first portion of the first dielectric layer from the top surface of at least one of the conductive features and stopping on the portion of the etch stop layer without etching a second portion of the first dielectric layer that is located between the conductive features;
    forming a second dielectric layer on the top surface of the at least one of the conductive features and on a top surface of the second portion of the first dielectric layer; and
    planarizing a top surface of the second dielectric layer.

2. The planarization method of claim 1 wherein the first dielectric layer is conformally deposited on the top surface of the conductive features and on the top surface of the substrate between the conductive features.

3. The planarization method of claim 2 wherein conformally depositing the first dielectric layer comprises:
    using a plasma enhanced chemical vapor deposition (PECVD) process to conformally deposit the first dielectric layer.

4. The planarization method of claim 1 wherein the first dielectric layer is deposited on the top surface of the conductive features and on the top surface of the substrate between the conductive features without a significant level of conformality.

5. The planarization method of claim 4 wherein depositing the first dielectric layer comprises:
using a high density plasma chemical vapor deposition (HDPCVD) process to non-conformally deposit the first dielectric layer.

6. The planarization method of claim 1 wherein selectively etching the first portion of the first dielectric layer from the top surface of the at least one of the conductive features further comprises:
applying a reverse mask layer having an aperture registered with the first portion of the first dielectric layer and the top surface of the at least one of the conductive features; and
performing a reactive ion etch process to etch the first portion of the first dielectric layer from the top surface of the at least one of the conductive features.

7. The planarization method of claim 1 wherein each of the conductive features has a height, the first dielectric layer has a thickness approximately equal to the height of the conductive features, and the second dielectric layer has a thickness smaller than the thickness of the first dielectric layer.

8. The planarization method of claim 7 wherein the thickness of the second dielectric layer is approximately equal to one-half of the height of the conductive features.

9. The planarization method of claim 1 wherein the first dielectric layer and the second dielectric layer are composed of the same dielectric material.

10. The planarization method of claim 1 wherein planarizing the top surface of the second dielectric layer further comprises:
using a chemical mechanical planarization process to planarize the top surface of the second dielectric layer.

11. The planarization method of claim 1 wherein each of the conductive features has a height measured relative to the top surface of the substrate that is greater than 1 μm.

12. The planarization method of claim 1 wherein the first portion of the first dielectric layer is only partially removed from the top surface of the at least one of the conductive features.

13. The planarization method of claim 1 wherein the first dielectric layer is not removed from the top surface of at least another of the conductive features.

14. A planarization method comprising:
forming a conductive layer on a substrate;
forming a bottom antireflection coating (BARC) layer on a top surface of the conductive layer;
patterning the conductive layer and the BARC layer on the top surface of the conductive layer to form a plurality of conductive features each covered by a portion of the BARC layer;
after the conductive layer and the BARC layer are patterned, depositing a first dielectric layer on a top surface of the conductive features and on a top surface of the substrate between the conductive features;
selectively etching a first portion of the first dielectric layer from the top surface of at least one of the conductive features and stopping on the portion of the BARC layer without etching a second portion of the first dielectric layer that is located between the conductive features;

forming a second dielectric layer on the top surface of the at least one of the conductive features and on a top surface of the second portion of the first dielectric layer; and
planarizing a top surface of the second dielectric layer.

15. The planarization method of claim 14 wherein the first dielectric layer is conformally deposited on the top surface of the conductive features and on the top surface of the substrate between the conductive features.

16. The planarization method of claim 15 wherein conformally depositing the first dielectric layer comprises:
using a plasma enhanced chemical vapor deposition (PECVD) process to conformally deposit the first dielectric layer.

17. The planarization method of claim 14 wherein the first dielectric layer is deposited on the top surface of the conductive features and on the top surface of the substrate between the conductive features without a significant level of conformality.

18. The planarization method of claim 17 wherein depositing the first dielectric layer comprises:
using a high density plasma chemical vapor deposition (HDPCVD) process to non-conformally deposit the first dielectric layer.

19. The planarization method of claim 14 wherein selectively etching the first portion of the first dielectric layer from the top surface of the at least one of the conductive features further comprises:
applying a reverse mask layer having an aperture registered with the first portion of the first dielectric layer and the top surface of the at least one of the conductive features; and
performing a reactive ion etch process to etch the first portion of the first dielectric layer from the top surface of the at least one of the conductive features.

20. The planarization method of claim 14 wherein each of the conductive features has a height, the first dielectric layer has a thickness approximately equal to the height of the conductive features, and the second dielectric layer has a thickness smaller than the thickness of the first dielectric layer.

21. The planarization method of claim 20 wherein the thickness of the second dielectric layer is approximately equal to one-half of the height of the conductive features.

22. The planarization method of claim 14 wherein the first dielectric layer and the second dielectric layer are composed of the same dielectric material.

23. The planarization method of claim 14 wherein planarizing the top surface of the second dielectric layer further comprises:
using a chemical mechanical planarization process to planarize the top surface of the second dielectric layer.

24. The planarization method of claim 14 wherein each of the conductive features has a height measured relative to the top surface of the substrate that is greater than 1 μm.

25. The planarization method of claim 14 wherein the first portion of the first dielectric layer is only partially removed from the top surface of the at least one of the conductive features.

26. The planarization method of claim 14 wherein the first dielectric layer is not removed from the top surface of at least another of the conductive features.

* * * * *